(12) United States Patent
White

(10) Patent No.: US 6,620,222 B2
(45) Date of Patent: Sep. 16, 2003

(54) COMPUTER AIR FILTERING SYSTEM

(76) Inventor: Troy Elliott White, R.R. 7, Box 1615, Palmyra, VA (US) 22963

( * ) Notice: Subject to any disclaimer, the term of this patent is extended or adjusted under 35 U.S.C. 154(b) by 0 days.

(21) Appl. No.: 09/726,579

(22) Filed: Dec. 1, 2000

(65) Prior Publication Data

US 2002/0066372 A1 Jun. 6, 2002

(51) Int. Cl.[7] ............................................... B01D 46/00
(52) U.S. Cl. ............................ 95/273; 95/26; 96/417; 96/418; 96/419; 96/424; 55/385.1; 55/385.6; 55/467; 206/223
(58) Field of Search ........................... 96/424, 425, 417, 96/418, 419; 95/26, 273; 55/385.6, 495, 496, 497, 529, DIG. 31, 385.1, 467; 454/184; 361/683, 684, 685, 686, 687; 206/223, 576

(56) References Cited

U.S. PATENT DOCUMENTS

| | | | |
|---|---|---|---|
| 4,751,872 A | | 6/1988 | Lawson |
| 4,786,295 A | * | 11/1988 | Newman et al. ............... 96/424 |
| 4,889,542 A | * | 12/1989 | Hayes ......................... 55/385.6 |
| 4,999,038 A | * | 3/1991 | Lundberg ..................... 55/495 |
| 5,364,458 A | * | 11/1994 | Burnett et al. ................ 55/496 |
| 5,365,221 A | * | 11/1994 | Fennell et al. ............... 320/136 |
| 5,514,036 A | | 5/1996 | Lin |
| 5,599,446 A | * | 2/1997 | Junker et al. ........... 55/DIG. 31 |
| 5,712,897 A | * | 1/1998 | Ortel .......................... 348/180 |
| 5,766,285 A | * | 6/1998 | Killman ..................... 55/385.6 |
| 5,827,340 A | * | 10/1998 | Fiske ......................... 55/385.6 |
| 5,879,423 A | * | 3/1999 | Luka et al. ............ 55/DIG. 31 |
| 5,912,369 A | * | 6/1999 | Reeves ....................... 55/385.6 |
| 5,914,453 A | * | 6/1999 | James et al. ................... 96/424 |
| 5,942,017 A | | 8/1999 | Van Winkle |
| 5,955,955 A | * | 9/1999 | Corcoran et al. ........... 361/687 |
| 6,077,336 A | * | 6/2000 | Ulrich et al. ................. 96/424 |
| 6,100,825 A | * | 8/2000 | Sedluk et al. ................. 341/51 |
| 6,104,607 A | * | 8/2000 | Behl .......................... 361/687 |
| 6,203,590 B1 | * | 3/2001 | Byrd et al. .................... 96/424 |
| 6,228,155 B1 | * | 5/2001 | Tai ............................... 96/419 |
| 6,229,694 B1 | * | 5/2001 | Kono ......................... 361/683 |
| 6,284,010 B1 | * | 9/2001 | Rehmert .................... 55/385.6 |

OTHER PUBLICATIONS

"Triple–Redundant Temperature Failure Detection", IBM Technical Disclosure Bulletin NN9503329, vol. 38, Mar. 1995, pp. 329–330.*

* cited by examiner

Primary Examiner—Duane Smith
Assistant Examiner—Jason M. Greene
(74) Attorney, Agent, or Firm—Charles Miller

(57) ABSTRACT

A system for filtering air entering the housing of a computer. A filter is placed in the path of air entering the computer housing. A timing program is installed on the computer to keep track of the total amount of time the computer has run since installation or service of the filter. After the computer has run for a predetermined amount of time, the program causes the computer to prompt the computer user to change or service the filter.

29 Claims, 13 Drawing Sheets

Computer Air Filter

Please indicate the time interval at which you wish to service your filter.

- ● 250 hours (dirty enviroment)
- ○ 500 hours (normal enviroment)
- ○ 750 hours (clean enviroment)
- ○ 1000 hours (sterile enviroment)
- ○ [000] hours Next>

COMPUTER AIR FILTERING SYSTEM

FIELD OF THE INVENTION

The present invention generally relates to personal computers and, more particularly, to a system for filtering air entering a computer housing.

BACKGROUND

All personal computers contain components which generate heat. Components such as the power supply and the Central Processing Unit, for instance, can generate significant quantities of heat. To prevent destructive heat build-up inside computer housings, manufacturers include some type of cooling system for most, if not all, computers.

Air circulation cooling systems are commonly used. Forced air circulation systems are currently being used, particularly in personal computer systems such as desktop systems. In a typical system, an opening is created in the computer housing so that external air can flow through the opening and over the heat generating components mounted within the computer housing. A fan is usually provided to force air through the housing to increase cooling efficiency.

These air circulation cooling systems generally work well, but do have problems.

Airborne dust and other contaminants enter the computer through the opening in the computer housing. When a fan is used, much more air and, consequently, much more dust is drawn into the computer housing. Some of this dust and contamination will remain inside the computer causing build-up of dust, for instance, on critical components. Dust accumulation on the processor decreases the cooling system's ability to conduct heat away from the processor and can shorten the processor life or lead to acute processor failure due to heat build-up. Similarly, dust accumulation on the power supply can cause failures due to excessive heat. Electrical shorts can be created where dust or contamination buildup across critical exposed circuitry such as across conductive pin contacts. Indeed, dust accumulation on the cooling fan motor itself reduces it's efficiency and can cause outright failure.

These problems can be somewhat alleviated by routine cleaning of the components within the computer housing but this is a time consuming and undesirable solution particularly for the casual or unsophisticated computer user. A better solution is needed.

SUMMARY OF THE INVENTION

The disclosed invention eliminates the above described problems. A filter is placed in the path of air coming into the computer housing so that all incoming air must pass through the filter. The filter will remove dust and other contaminants from the air thereby substantially eliminating dust build-up on computer components. No dust equals no dust buildup.

Since filters themselves eventually clog up and can block air flow, a system is also provided to remind the computer user to change or clean the filter at certain times.

A timing program is installed in the computer.

This program monitors the total amount of time that the computer has run since a filter was installed on the computer. Once a selected time interval for recommended filter change, or service, has elapsed, the program causes the computer to give an indication to the user that it is time to change or service the filter. In a preferred embodiment, the computer will display a message on it's monitor that the filter requires service and should be changed or cleaned, etc. Other types of indicators such as distinctive sounds or oral messages may be used.

BRIEF DESCRIPTION OF THE DRAWINGS

FIG. 5 is an example of a screen.

DETAILED DESCRIPTION

Figure 1:
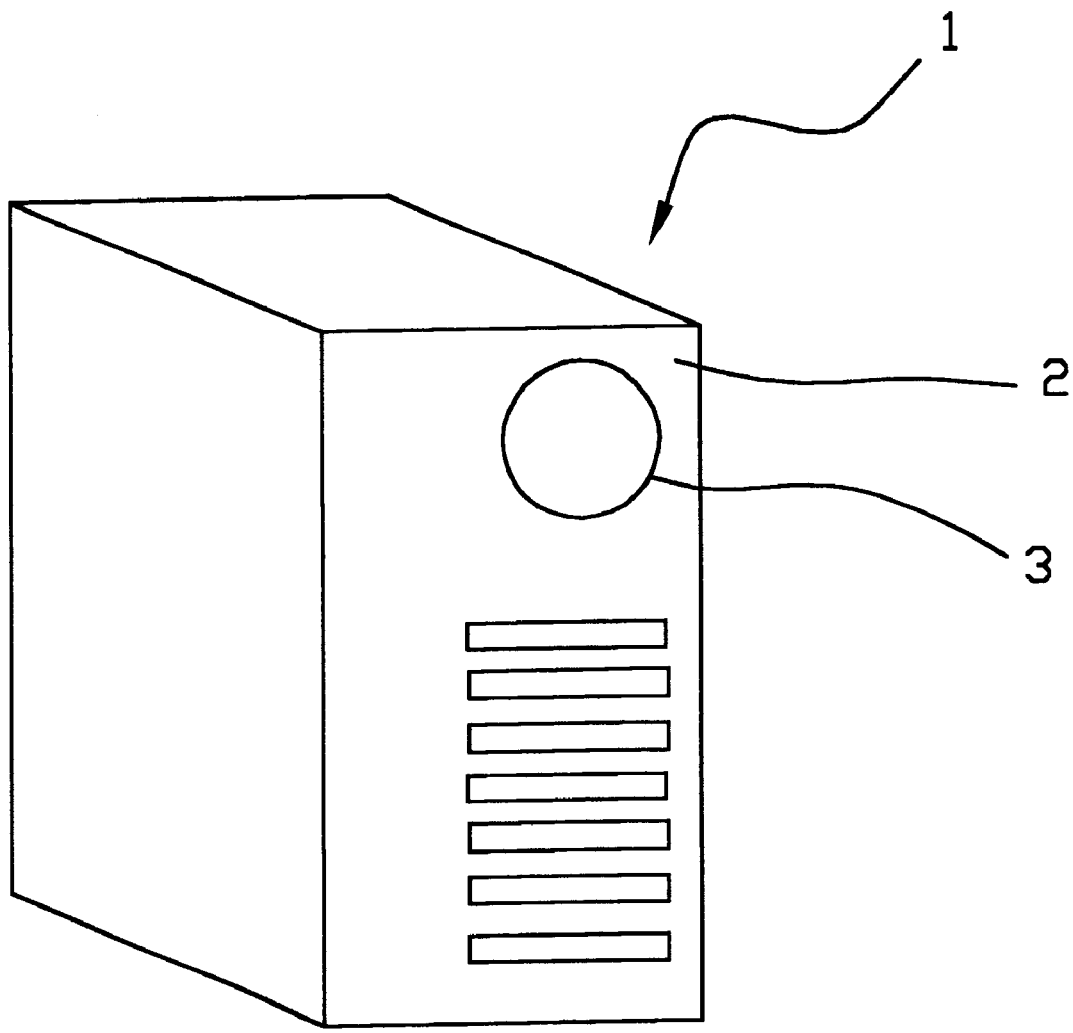
FIG. 1 is a stylized illustration of a housing for a personal computer.
Figure 2:
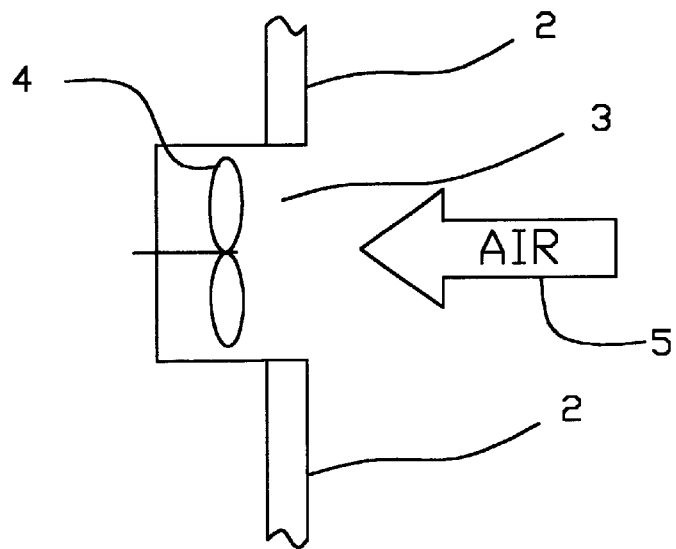
FIG. 2 is a stylized illustration of a cutaway view of a fan mounted on a computer housing.

FIG. 1 is a stylized illustration of a housing for a personal computer. Item 2 is the backside of the housing. Item 3 is a hole or opening formed in the backside 2. Hole 3 allows air to enter housing 1 to cool various computer components within the housing such as the central processing unit, the power supply or other heat generating components of the computer. Many commercially available computers utilize a fan mounted inside the computer housing to pull external air into an opening such as item 3 to increase the flow of air entering the opening. The air subsequently flows over components to be cooled. The fan is often mounted directly adjacent to the opening, on the inside of the housing. FIG. 2 is a stylized illustration of a cutaway view of a fan, item 4, mounted on the inside of a computer housing and to a wall, item 2, of the computer. The fan pulls air, 5, through opening 3 into the inside of the computer housing. It should be understood that while the hole 3 has been shown on the backside of the computer housing, it could be on any side of the computer, or on the front or top. Also, the hole has been shown as being round but the hole could be of any shape or could be comprised of multiple openings.

Figure 3:
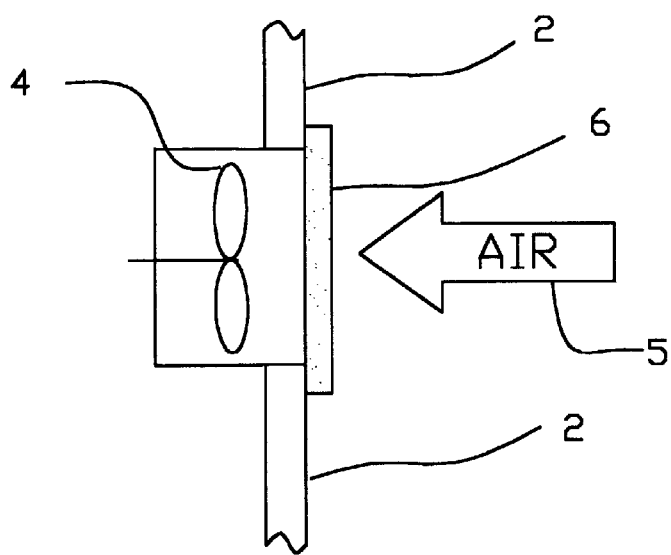
FIG. 3 is an illustration like FIG. 2 with an air filter added.

FIG. 3 is similar to FIG. 2 but with a filter, item 6, added. The filter, 6, in this example, is added to the outer side of item 2. Air, 5, entering the computer housing now passes through filter 6 and into the inside of the housing. Filter 6 will remove dust and other contaminants from the cooling air, 5.

Figure 4:
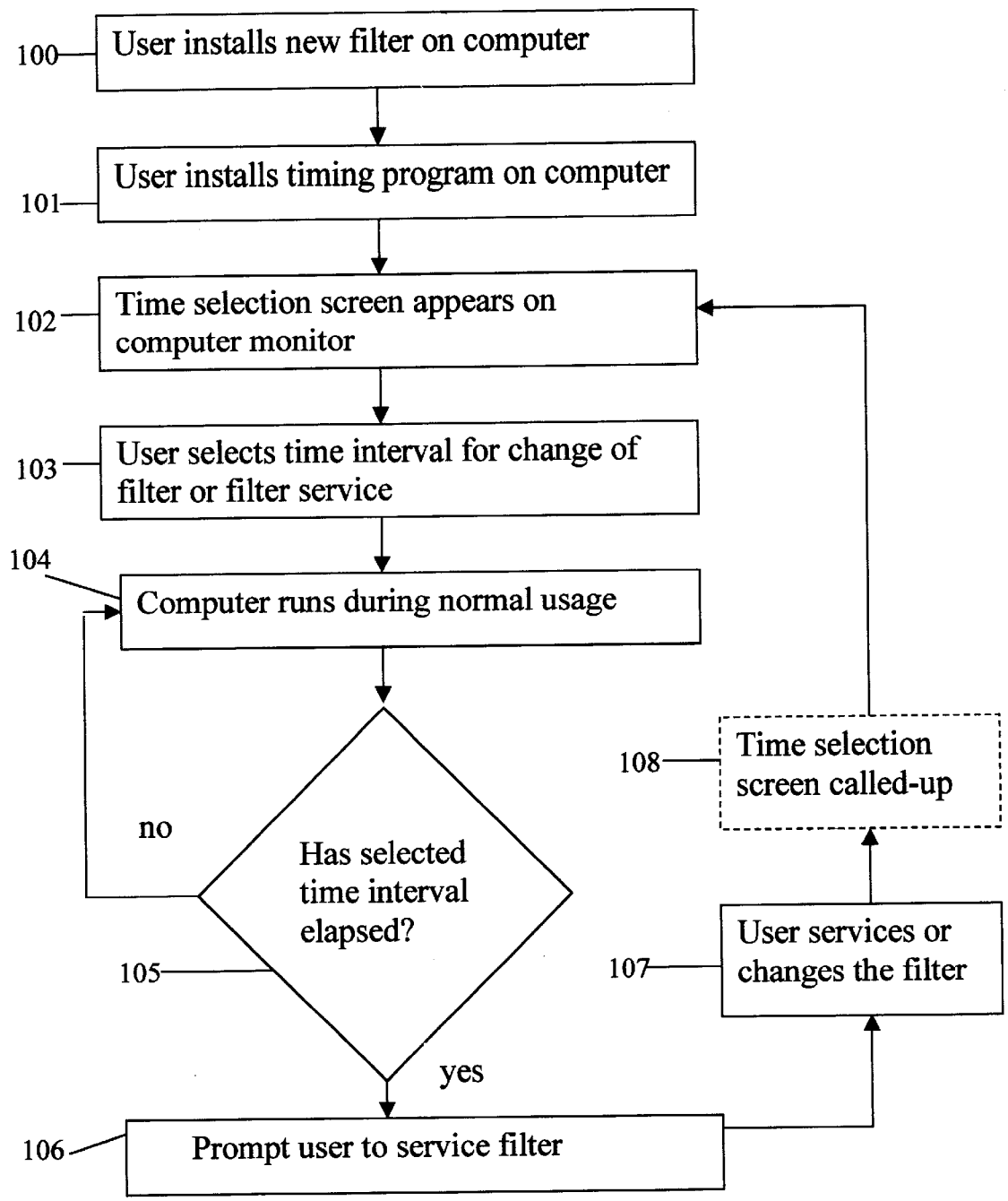
FIG. 4 is a block diagram of the overall process of the invention.

FIG. 4 depicts the overall process of a preferred embodiment of the invention. At item 100, the computer user physically installs the new filter on the computer so that air entering the computer housing will be filtered to remove dust and other contaminants. Filter 6 in FIG. 3 is one such example of a filter. At step 101, the user installs the timing program on the computer. This program, in general, keeps track of the total amount of time that the computer runs. At step 102, the timing program causes the computer to display a screen which asks the user to select a time interval for changing, or cleaning, the filter.

This step and the following step, 103, may be omitted if a single time interval is predetermined, making a selection unnecessary.

At step 103, the user selects a time interval for change or cleaning of the filter. At the moment of such selection, the timing clock is effectively set to zero and begins metering the total amount of time the computer runs. Step 104 indicates the normal usage and running of the computer.

Step 105 indicates a check to see if the accumulated amount of computer running time is equal to or greater than the user selected time interval. If not, the process goes back to step 104 and continues to accumulate more computer running time as it occurs. If yes at step 105, the process moves to step 106 where the program prompts the user to service the filter either by changing the filter or cleaning the filter or simply ascertaining that the filter is okay as is. Thereafter, the process will, in effect, reset the timer to zero and begin a new timing cycle. One way this last process may be completed is by proceeding to step 107 where the user services or changes the filter. Thereafter, the time selection screen can be called-up at 108 if it does not already appear, and the process moves back to step 102 to repeat the cycle of selecting an interval for change or service, running the computer until that time interval has elapsed and servicing the filter.

FIG. 5 is an example of a screen produced by the timing program to assist a user in selecting a time interval for changing the filter. This screen would normally be displayed on the computer's monitor. As can be seen in FIG. 5, the display prompts the user to select a particular time interval such as 250 or 500 or 750 hours, etc. As indicated at item 200 provisions could be made to allow a user to select any time interval the user desired by simply filling-in a time interval in block, item 201.

Figure 6:
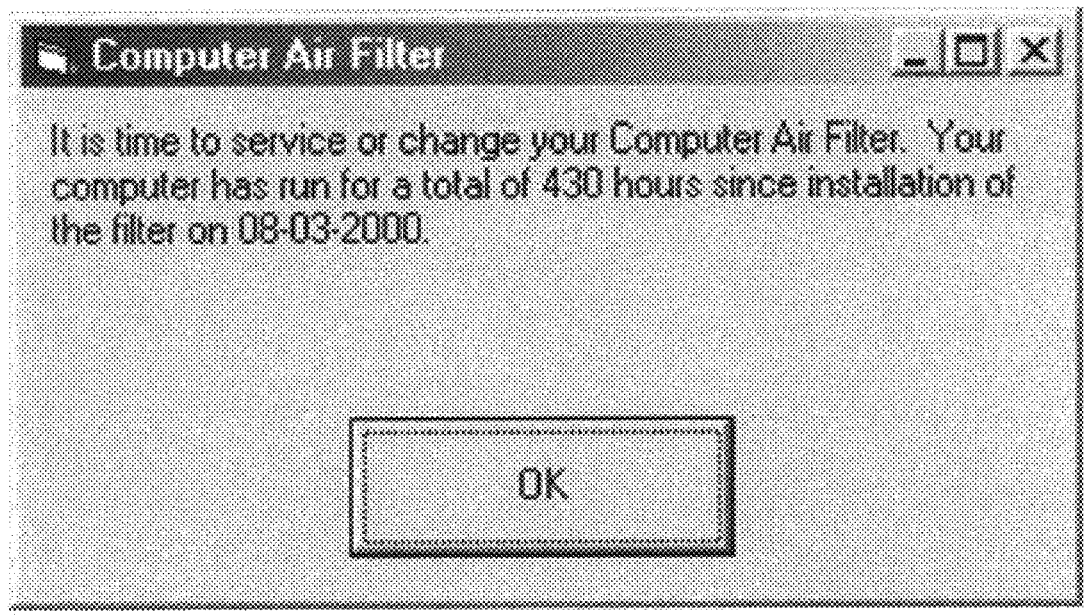
FIG. 6 is an example of one way to prompt the computer user by using a screen.

FIG. 6 illustrates one possible way to inform the computer user that it is time to service or change the air filter. The screen shown in FIG. 6 will appear after the computer has run for a total amount of time equal to the time interval selected by the user, or after a time equal to a preset time interval in a system where the user is unable to select a time interval.

In another embodiment, the program could also cause the computer to emit a sound, such as a beep or other distinctive sound, to inform the computer user that the time to service the filter has arrived. The program could also cause the computer to synthesize and emit a human voice to prompt the computer user to service the filter. The voice could deliver a short message such as "Please check this computer's air filter", or any other appropriate message. The program could also prompt the user by printing out a hard-copy message or indication that the time to service or change the filter has arrived.

The timing program may be made resident in the computer memory as software or the program may be installed as firmware or the computer may be hardwired to perform the timing program functions.

In one embodiment for a computer system running a WINDOWS operating system, a timing program was written in VISUAL BASIC 6.0. In that WINDOWS system, each time the computer is turned-on WINDOWS looks at the registry to get the saved settings. A line was added in that registry to start the Air filter timing program. So, every time the computer is started, the program is started too, and it starts counting. Every couple of seconds, the program saves its settings to the registry. So, whenever the computer is turned off, the counting stops and the accumulated count is saved. When the computer starts again the program resumes counting clock pulses thereby keeping track of the total amount of time the computer has run. Since computers start generating heat anytime they are turned-on, the computer systems typically start their cooling systems substantially at turn-on time. This means that external air normally begins entering the computer housing at or near turn-on time for those systems using air circulation cooling. This means that a measure of computer run time is a measure of air filter usage time. In those systems, using a fan for cooling, the fan normally comes on at startup. If the fan is designed to go on and off at times other than computer startup and shutdown, the signals which cause the fan to start and stop could be monitored directly.

The exact timing program will be determined by the particular computer and the particular operating system and the particular programming language used following the principles set forth herein. Generating such a program is well within the capability of a person skilled in these arts.

Figure 7:
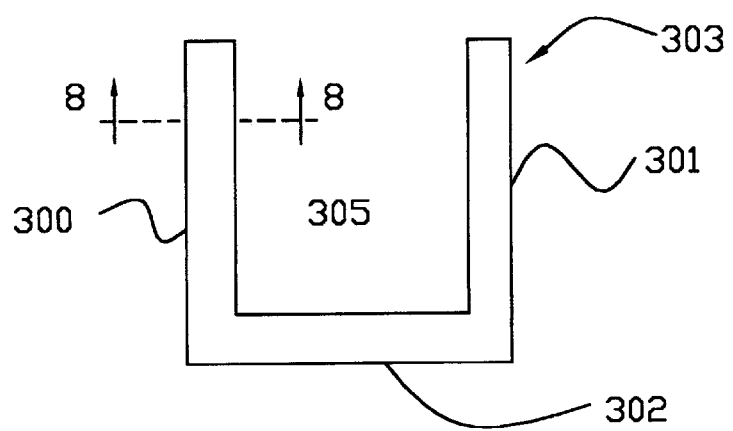
FIG. 7 is a side view of a bracket.
Figure 8:
FIG. 8 is a sectional view of the bracket of FIG. 7.
Figure 9:
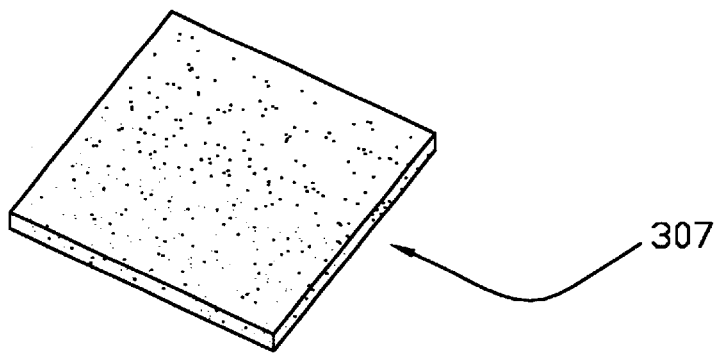
FIG. 9 illustrates a filter.
Figure 10:
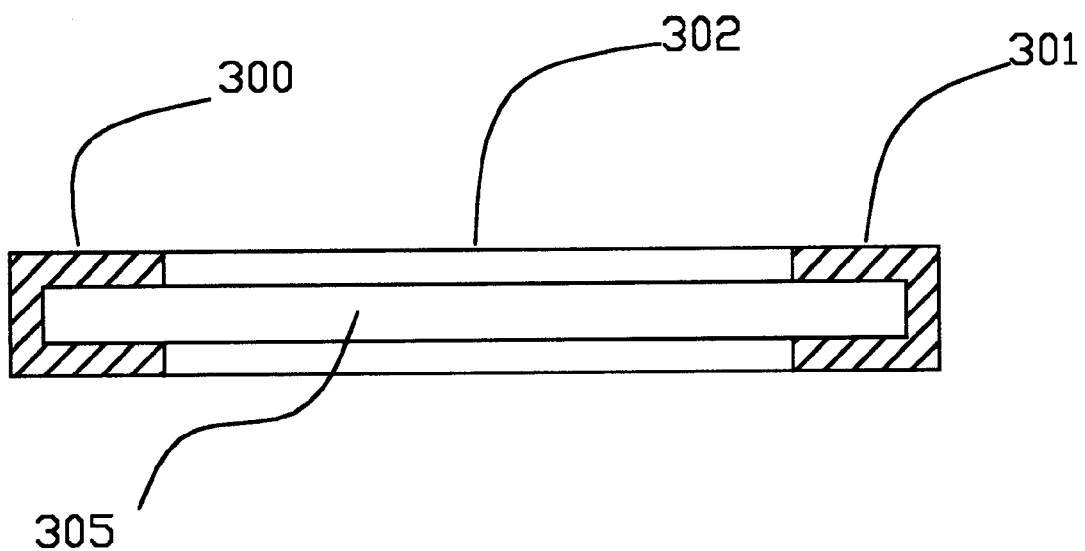
FIG. 10 is an end view of the bracket of FIG. 7.

FIG. 7 is an example of a side view of a bracket 303 for holding a filter. It consists of two substantially parallel and spaced apart sections 300 and 301 joined by a connecting section 302. FIG. 8 is a cross-sectional view of bracket 303 at section 8—8. It consists of a generally U shaped section with an opening at 304. Each of sections 300, 301 and 302 of bracket 303 has the same U shaped cross sectional construction with the opening 304 facing the interior portion 305 of the bracket. This creates a space into which a thin rectangular shaped filter such as item 307 shown in FIG. 9 may be inserted. This space 305 is further illustrated in FIG. 10 which shows an end view of bracket 303 looking down from the top.

Bracket 303 may be attached to the opening in the computer housing in a number of different ways as by using screws or adhesive. In a preferred embodiment it is adhesively attached. This could be done by applying a layer of adhesive to one side of bracket 303 and adhering it to the computer housing.

Figure 11:
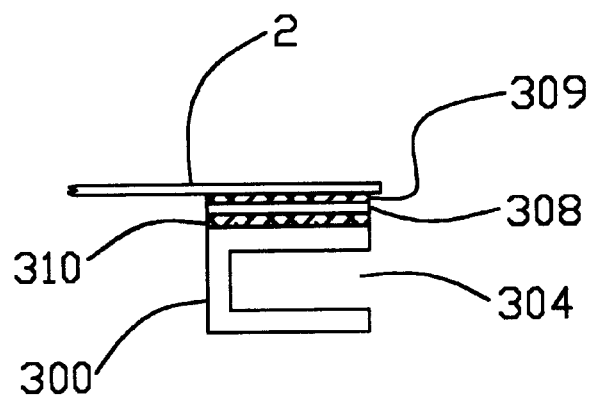
FIG. 11 illustrates a way to adhere a bracket to a computer housing.

FIG. 11 illustrates another way to adhesively bond the bracket 303 to the housing. FIG. 11 shows a cross sectional view of bracket 303 section 300 with tape 308 having adhesive layers 310 and 309 on either side of it. Adhesive layer 310 bonds tape 308 to the bracket section and adhesive layer 309 bonds the tape 308 to the computer housing wall, a piece of which is shown as item 2. Preferably, the tape and adhesive would be applied to one side of all sections of bracket 303, so that the entire side of the bracket would be continuously adhered to the computer housing without breaks in the adhesive.

Figure 12:
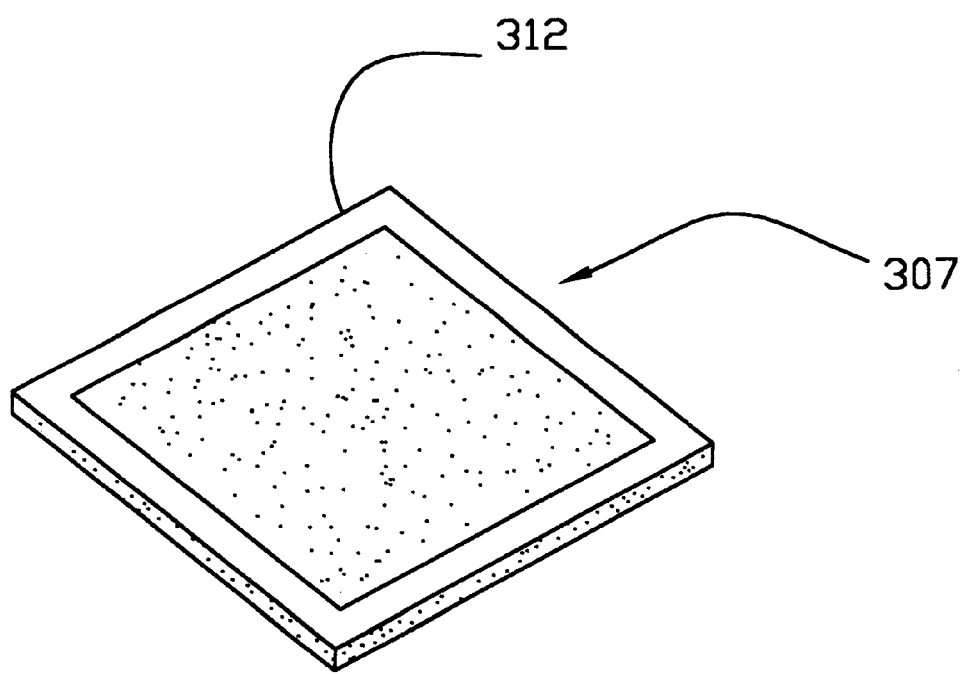
FIG. 12 illustrates a filter with adhesive.

FIG. 12 illustrates another filter arrangement for filtering the air entering the computer housing. In this embodiment, the filter frame is eliminated and the filter itself is directly adhered to the computer housing. In FIG. 12, item 307, is a filter similar to filter 307 of FIG. 9. In this case, the fitter has a layer of adhesive, item 312, on one side of the filter. As can be seen from FIG. 12, the layer extends from all the outer edges of the filter inward a sufficient distance to provide enough bonding surface between the filter and the computer housing to securely hold the filter in place. In an example where the opening in the computer housing for air entry was a hole three inches in diameter, the filter was rectangular having sides of about 3 and three-fourths inches by 3 and three-fourths inches with a three eighths inch wide adhesive layer provided all around the filter on one side.

Figure 13:
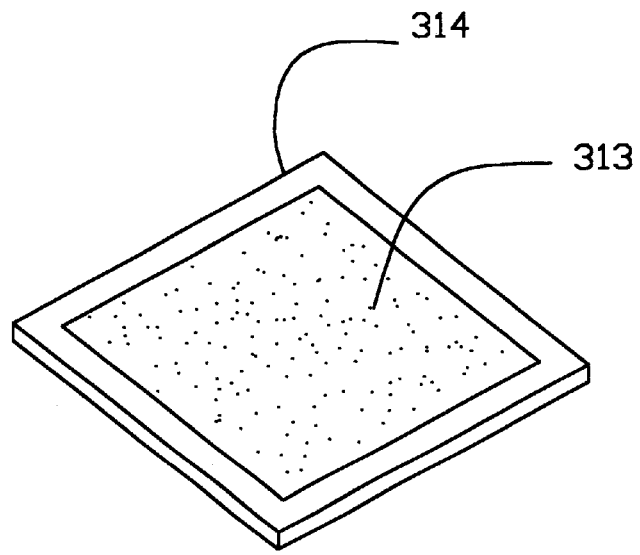
FIG. 13 is another embodiment of a filter.
Figure 14:
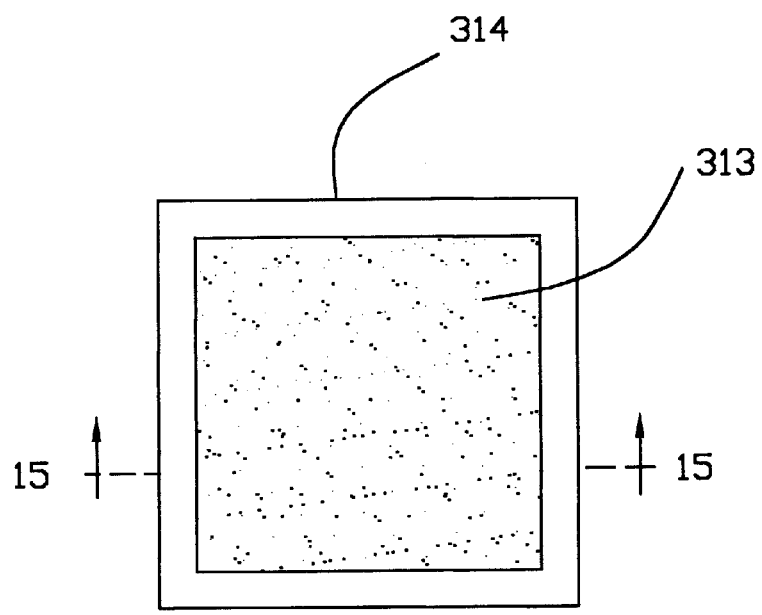
FIG. 14 illustrates one side of the filter of FIG. 13.
Figure 15:
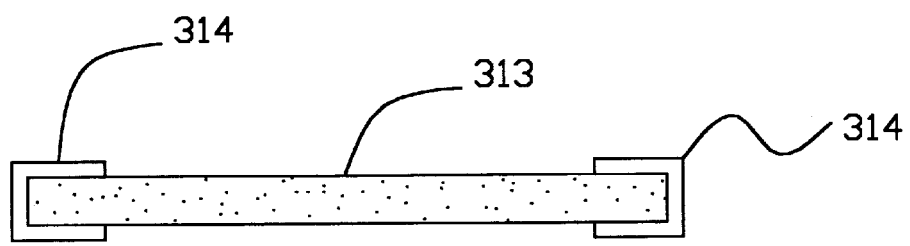
FIG. 15 is a sectional view of the filter of FIG. 13.
Figure 16:
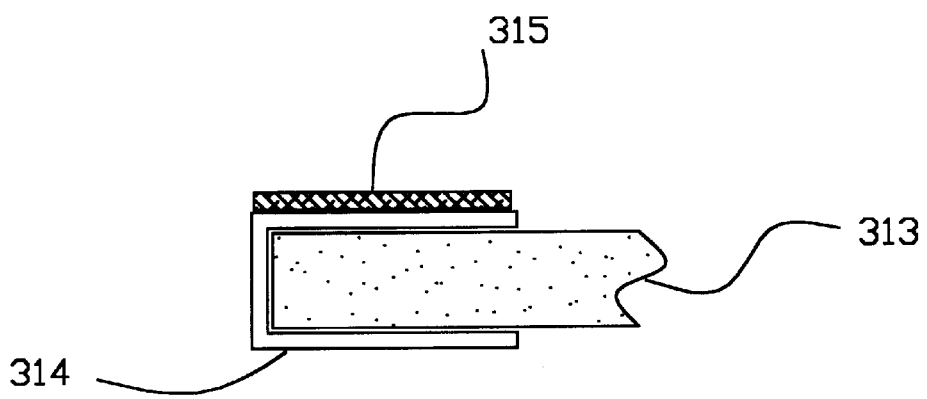
FIG. 16 is a partial view of the filter of FIG. 13 with an adhesive layer.

FIG. 13 shows another embodiment of a filter. In this embodiment, the filtering material 313 has a frame 314 permanently attached. FIG. 14 shows one side of the filter. FIG. 15 is a cross sectional view of the filter of FIG. 14 along 15—15. The thickness of frame portions 314 has been exaggerated to illustrate the principles of the invention. Frame 314 would be made of paper in at least one embodiment and accordingly would be much smaller and thinner relative to filter material 313. Frame 314 could also be made of plastic or metal. Frame 314 could be adhered to the computer housing using an adhesive layer 315 as shown in FIG. 16. It could also be adhered using the tape and double sided adhesive shown in FIG. 11.

The filters per se used in this invention may be made of any type of suitable known filter material. For instance, they can be made of fiberglass material, foam material or of paper.

Figure 17:
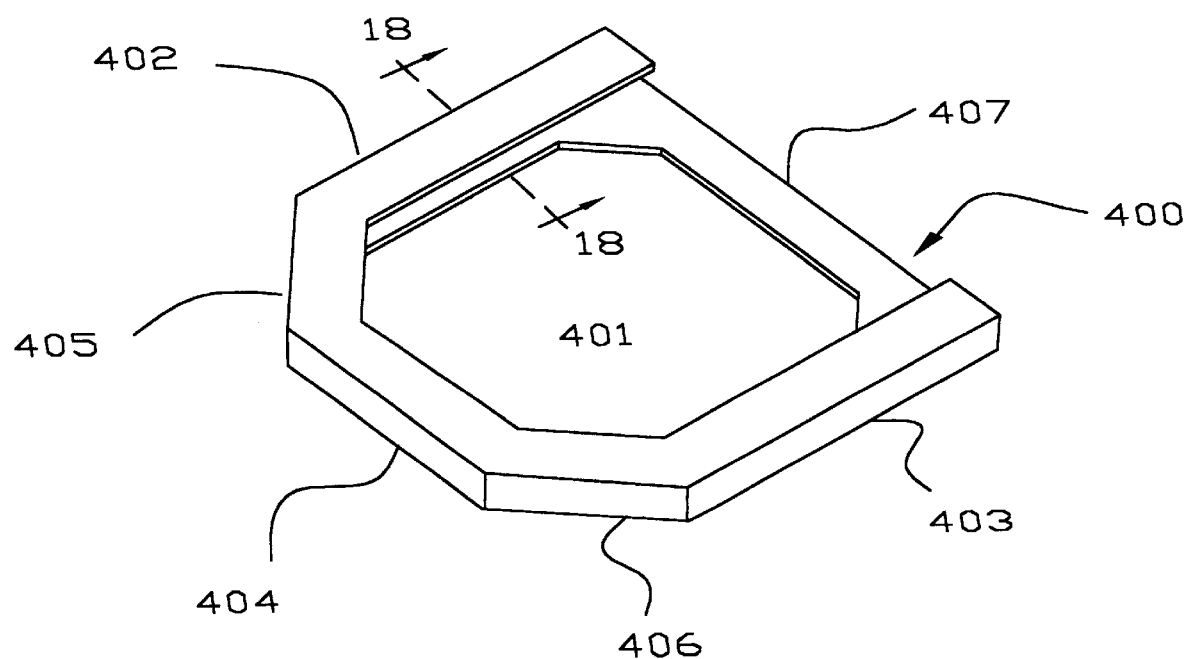
FIG. 17 illustrates a frame for a filter.

FIG. 17 is another embodiment of a frame, 400, for a computer filter. Item 401 identifies an opening in that frame. Item 402 is a first side member, item 403 a second member parallel to item 402.

Figure 18:
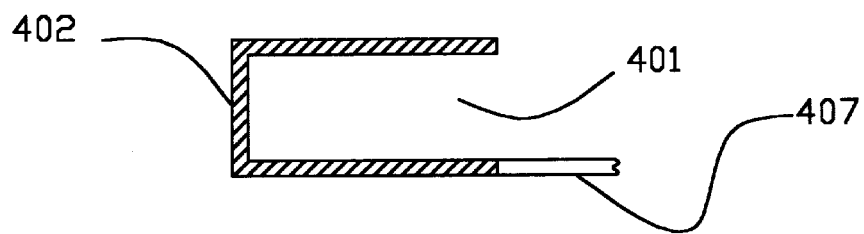
FIG. 18 is a view of a section of the frame of FIG. 17.
Figure 20:
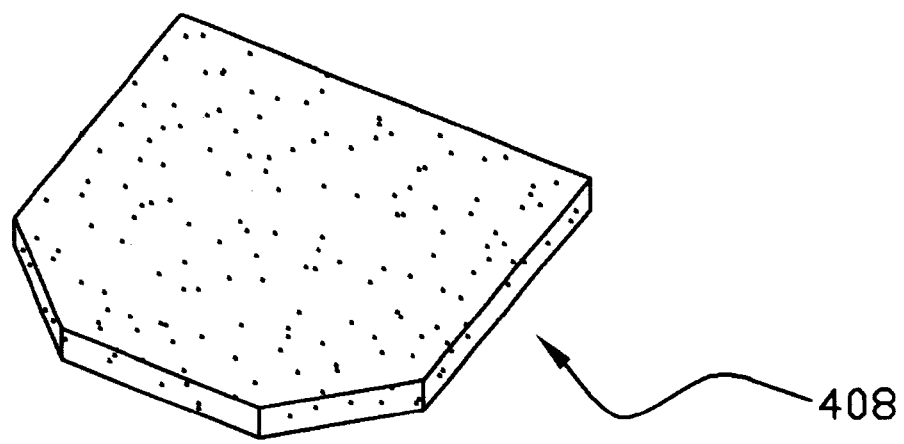
FIG. 20 illustrates a filter for use in a frame as shown in FIG. 17.
Figure 21:
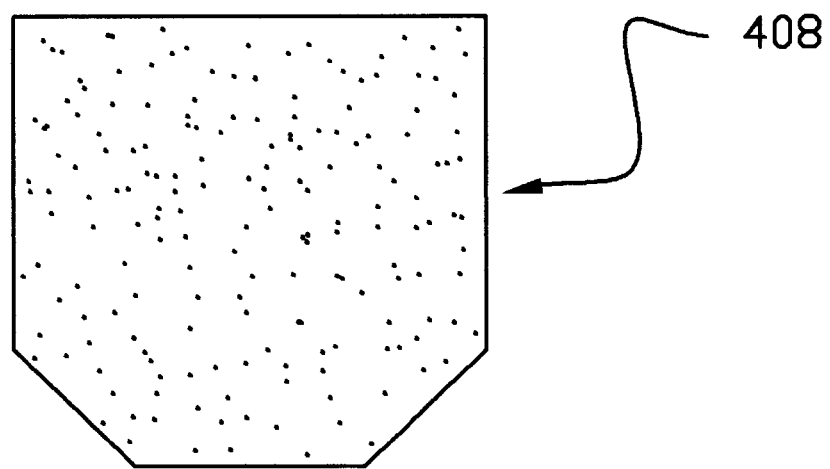
FIG. 21 shows a side view of the filter of FIG. 20.

Item 404 is a third side member and items 405 and 406 fourth and fifth side members. Item 407 is a top cross member connecting the top ends of members 402 and 403. FIG. 18 is a cross-sectional view of bracket member along section 18—18. Each of members 402, 403, 404, 405 and 406 have similar U shaped cross-sections with the open end of the U facing opening 401 and creating an area for receiving and holding a filter 408 as shown in perspective in FIG. 20, and in a side view in FIG. 21.

Figure 19:
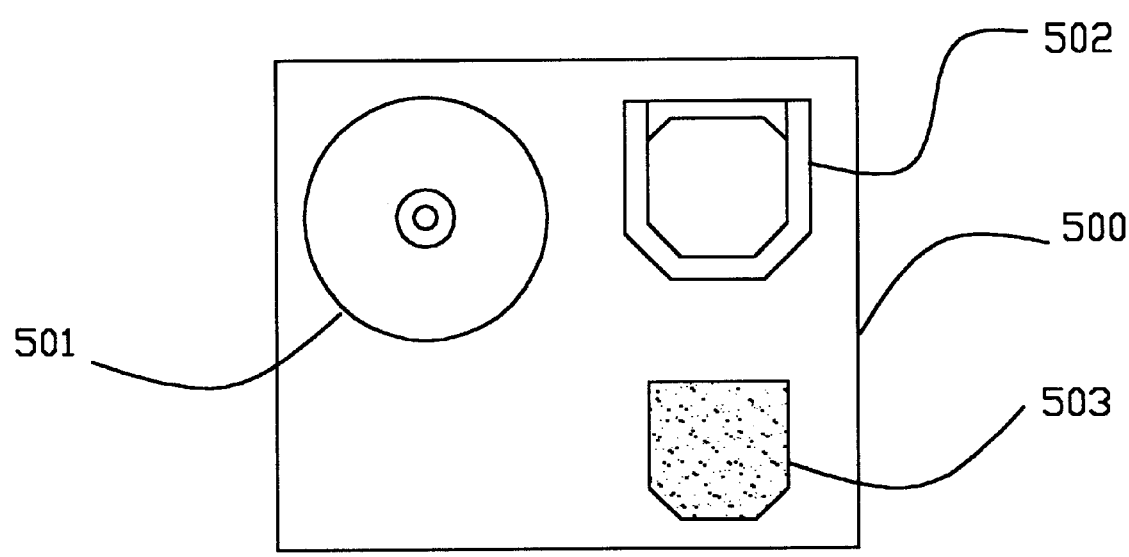
FIG. 19 illustrates a kit for implementing the methods of the invention.

FIG. 19 illustrates a kit containing components for implementing the computer air filtering method of the invention disclosed. Referring to FIG. 19, item 500 represents packaging or a box or other containment device for the components shown within the block. Item 501 represents a medium for storing the computer filter timing program. This medium could be a CD ROM, a DVD, a solid state device, a tape, a floppy disk or any other device to store digital data. Item 502 represents a filter bracket for attachment to a computer housing. Item 503 represents a filter for filtering the air entering a computer housing.

Any of the filter brackets described herein may be made of plastic or fiberglass or metal or even of paper. Also the bracket does not have to be attached to the exterior of a computer housing. It could be placed inside the housing. It could also be formed as a part of the housing for instance at the time of manufacture of the housing.

It should be understood that the principles of this invention are also applicable to computers other than stationary models. For instance, the filter system can be installed on laptop computers, handheld computers or any type of computer having an opening in the computer's housing for entry and circulation of external air.

While this invention has been disclosed in connection with what is presently considered to be the preferred embodiments, it should be understood that the invention is not limited to the disclosed embodiments but is intended to cover various modifications and equivalent arrangements included within the spirit and scope of the appended claims.

I claim:

1. A system for protecting a computer having an air circulation system comprising:
    a filter for filtering air entering the computer through an air intake; and
    a timing system which causes said computer to monitor the amount of time the filter has filtered air entering the air intake.
2. A system as in claim 1 wherein the computer has a fan for circulating air and the filter is positioned to filter the air drawn through the fan.
3. A system as in claim 1 wherein the timing system displays the total amount of time that the filter has filtered entering air.
4. A system as in claim 3 wherein the time is displayed on a computer monitor.
5. A system as in claim 1 including a graphical user interface with provisions for entry of a time indication for changing the filter.
6. A system as in claim 1 which additionally includes an alarm system for indicating that a filter should be checked.
7. A system as in claim 6 wherein said alarm provides a flashing visual indication.
8. A system as in claim 6 wherein said alarm provides an aural indication.
9. A system as in claim 8 wherein said aural indication includes a human voice.
10. A system as in claim 6 wherein said alarm is printed.
11. A system as in claim 1 wherein said computer is a personal computer.
12. A system as in claim 1 wherein said computer is a laptop computer.
13. A system as in claim 1 where said computer is a palm size computer.
14. A maintenance kit for a computer comprising:
    a filter for filtering air entering said computer; and
    a medium containing a program for installation on said computer to provide to a user an indication that some action should occur regarding the said filter.
15. A maintenance kit as in claim 14 wherein the said action is changing the filter.
16. A maintenance kit as in claim 14 wherein the said action is cleaning the filter.
17. A kit as in claim 14 wherein the medium is a CD ROM.
18. A maintenance kit as in claim 14 wherein the medium is a DV disk.
19. A maintenance kit as in claim 14 wherein the medium is a solid state device.
20. A maintenance kit as in claim 14 wherein the medium is a firmware device.
21. A personal computer comprising:
    a housing containing heat generating components;
    said housing having an opening formed in it for allowing external air to enter the housing to cool the said heat generating components;
    a replaceable filter mounted on said housing in proximity to said opening to filter unwanted contaminants from the air entering said opening; and
    a program resident in a memory within said computer for measuring the accumulated amount of time that the computer has run since the said filter was installed on the computer housing.
22. A personal computer as in claim 21 further comprising:
    a computer monitor for displaying an indication that the said filter should be serviced.

23. A personal computer as in claim 22 wherein the indication that the said filter should be serviced is an indication that said filter should be replaced.

24. A method for protecting a computer mounted in a housing which has an air circulation system which causes external air to enter the housing through an opening formed in a wall of the housing comprising:
   locating a filter in a position to filter air entering the said housing;
   installing a program on the said computer to enable the computer to monitor the time that the filter filters incoming air; and
   displaying a screen on the monitor of the computer for selection of a time interval for servicing the filter.

25. A method as in claim 24 wherein computer is a palm size computer.

26. A method as in claim 24 wherein the program is operative with the computer to cause the computer to provide an indication that the filter should be serviced.

27. A kit for a computer having a housing comprising:
   a filter for filtering air entering said housing; and
   a medium containing a program for installation on said computer to cause said computer to monitor the time that said filter filters said air.

28. A kit as in claim 27 wherein said program is operative with said computer to provide a graphical user interface.

29. A kit as in claim 27 wherein said program is operative to cause said computer to provide an indication that filter service may be necessary.

* * * * *